(12) United States Patent
Cheng et al.

(10) Patent No.: US 7,773,718 B2
(45) Date of Patent: Aug. 10, 2010

(54) SHIFT REGISTER CIRCUIT

(75) Inventors: Tung-Shuan Cheng, Tainan County (TW); Yueh-Hsiu Liu, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 25 days.

(21) Appl. No.: 11/971,165

(22) Filed: Jan. 8, 2008

(65) Prior Publication Data
US 2009/0110138 A1 Apr. 30, 2009

(30) Foreign Application Priority Data
Oct. 29, 2007 (TW) ................................ 96140571 A

(51) Int. Cl.
*G11C 19/00* (2006.01)
(52) U.S. Cl. .............................. 377/64; 377/69; 377/70; 377/75
(58) Field of Classification Search ................... 377/64, 377/68, 69, 72–73, 75–78, 81
See application file for complete search history.

(56) References Cited

U.S. PATENT DOCUMENTS 5,282,234 A * 1/1994 Murayama et al. ............ 377/69
5,363,424 A * 11/1994 Fujisawa ...................... 377/69
6,418,182 B1 * 7/2002 Suyama et al. ................ 377/69
6,556,647 B1 * 4/2003 Neravetla ..................... 377/70
6,813,331 B1 * 11/2004 Yu et al. ....................... 377/69
6,963,327 B2 * 11/2005 Kawahata et al. ........... 345/100
6,996,203 B2 * 2/2006 Onda et al. .................... 377/75
7,224,341 B2 * 5/2007 Ishii et al. ................... 345/100
7,295,647 B2 * 11/2007 Harada ........................ 377/64
7,369,111 B2 * 5/2008 Jeon et al. .................... 345/100
2006/0210012 A1 * 9/2006 Yamaguchi et al. ........... 377/64

* cited by examiner

*Primary Examiner*—Tuan Lam
(74) *Attorney, Agent, or Firm*—Winston Hsu

(57) ABSTRACT

A shift register circuit includes a plurality of bit register units, coupled in series, for transferring an input signal among the plurality of bit register units to sequentially output the input signal to a plurality of data output terminals according to a control signal and a clock signal, wherein the number of the plurality of data output terminals is greater than that of the plurality of bit register units, and a control unit for generating the control signal to control transference of the input signal.

14 Claims, 19 Drawing Sheets

SHIFT REGISTER CIRCUIT

BACKGROUND OF THE INVENTION

1. Field of the Invention

The present invention relates to a shift register circuit, and more particularly, to a shift register circuit capable of cyclically using flip-flops for saving the number of flip-flops that need to be used.

2. Description of the Prior Art

In digital circuits, a shift register, which generally includes a plurality of series connected flip-flops, is a widely used logic circuit unit, and can perform operations such as data registering, delay or conversion of serial and parallel output for input binary data. For example, when applied in liquid crystal display (LCD) driver circuits, the shift registers are utilized for sequentially providing pulse signals to a plurality of data output terminals according to a clock signal, such that data driving signals or gate driving signals can be outputted line-by-line for driving corresponding pixels.

Please refer to FIG. 1 and FIG. 2. FIG. 1 and FIG. 2 are functional block diagrams of a source driver circuit 10 and a gate driver circuit 20 of a conventional LCD, respectively. The source driver circuit 10 includes a shift register 110, a sampling control circuit 120 and an output buffer 130. The gate driver circuit 20 includes a shift register 210 and an output buffer 230. In the source driver circuit 10, the shift register 110 is utilized for sequentially outputting pulse signals L1~Ln to the sampling control circuit 120 for enabling latch circuits inside the sampling control circuit 120 (not shown in FIG. 1) according to an input pulse signal DIN1 and a clock signal CLK, so that video data RGB_Data can be sampled accordingly. Then, the output buffer 130 can output the data driving signals to data lines D1~Dn according to sampled voltages of the video data RGB_Data. Similarly, in the gate driver circuit 20, the shift register 210 is utilized for sequentially providing pulse signals to the output buffer 230 for outputting the gate driving signals to scan lines S1~Sn according to an input pulse signal DIN2 and a clock signal CLK2. Detailed operations of the LCD driver circuits are well known by those skilled in the art, and thus not described herein.

Please refer to FIG. 3. FIG. 3 is a schematic diagram of a conventional shift register 30. The shift register 30 can be the shift register 110 in FIG. 1 or the shift register 210 in FIG. 2, and includes series-coupled flip-flops FF1~FFn and data output terminals OP1~OPn. Each of the flip-flops FF1~FFn further includes an input terminal D, an output terminal Q and a clock input terminal C, and is utilized for shifting a logic level received by the input terminal D to the output terminal Q according to a clock signal CLK received by the clock input terminal C. In general, the output terminal of each flip-flop is coupled to the input terminal of a next stage flip-flop and a corresponding data output terminal. Thus, when an input signal DIN is inputted to the input terminal of the first flip-flop FF1, the shift register circuit 30 then forward transfers a logic level of the input signal DIN stage-by-stage according to the clock signal CLK to output pulse signals to the data output terminals OP1~Opn in order. As for the related signal sequence, please refer to FIG. 4.

Please further refer to FIG. 5. FIG. 5 is a schematic diagram of another conventional shift register 40. In the shift register 40, the input terminal of each flip-flop is further coupled to an input switch unit SW. The input switch unit SW includes a first switch SW1 and a second switch SW2, and is utilized for controlling the first switch SW1 and the second switch SW2 to couple the input terminal of each flip-flop to an output terminal of a former stage flip-flop or that of a next stage flip-flop according to a direction control signal UD, so as to enhance flexibility when using the shift register 40. For example, the input switch unit SW can short the first switch SW1 for coupling the input terminal of each flip-flop to the output terminal of a former stage flip-flop according to a low logic level of the direction control signal UD; and can short the second switch SW2 for coupling the input terminal of each flip-flop to the output terminal of a next stage flip-flop according to a high logic level of the direction control signal UD. In this case, when the input terminal of each flip-flop is coupled to the output terminal of a next stage flip-flop, the shift register 40 can then backward transfer the input signal UIN received by the input terminal of each flip-flop stage-by-stage according to the clock signal CLK, for outputting pulse signals to corresponding data output terminals OP1~OPn in reverse order. As for the related signal sequence, please refer to FIG. 6.

Therefore, utilizing the input switch unit SW, the shift register 40 can switch the first switch SW1 and the second switch SW2 for forward or backward transferring the input signal according to the direction control signal UD, so as to output the pulse signals to the data output terminals OP1~OPn in order or in reverse order. However, no matter how the input signal is transferred, each data output terminal needs one flip-flop for generating the pulse signal, and thus the number of the flip-flops has to be equal to that of the data output terminals. In some applications such as the gate driver circuits or the source driver circuits of the LCD, the shift register has to be used for transferring signals and sequentially outputting the signals to hundreds of data output terminals in order. In this case, hundreds of flip-flops are needed to realize the shift register. In fact, when the input signal is transferred in the shift register, only one or a few flip-flops are in operation (i.e. generating pulse signals) at the same time, but the remaining flip-flops are on standby. Thus, such shift registers waste circuit area and production cost.

SUMMARY OF THE INVENTION

It is therefore a primary objective of the present invention to provide a shift register circuit.

The present invention discloses a shift register circuit. The shift register circuit includes a plurality of bit register units, coupled in series, for transferring an input signal among the plurality of bit register units to sequentially output the input signal to a plurality of data output terminals according to a control signal and a clock signal. The number of the plurality of data output terminals is greater than that of the plurality of bit register units. The shift register circuit further comprises a control unit coupled to the plurality of bit register units for generating the control signal to control transference of the input signal.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
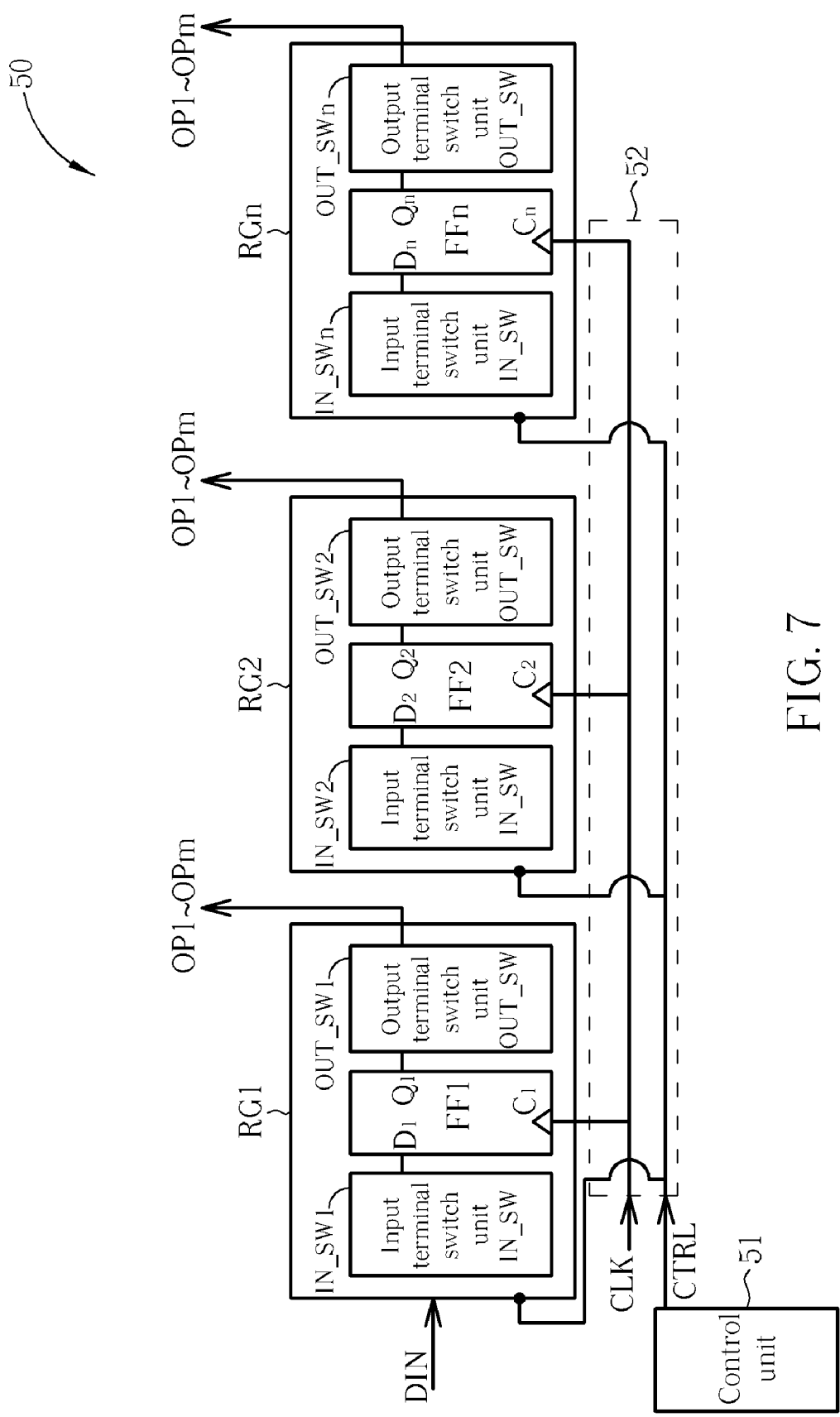
FIG. 7 is a functional block diagram of a shift register of the present invention.

Please refer to FIG. 7. FIG. 7 is a functional block diagram of a shift register 50 of the present invention. The shift register 50 includes bit register units RG1~RGn, data output terminals OP1~OPm and a control unit 51. The bit register units RG1~RGn are connected in series through a bus line 52, and are utilized for transferring an input signal DIN among the bit register units RG1~RGn to sequentially output the input signal to the data output terminals OP1~OPm according to a control signal CTRL and a clock signal CLK carried on the bus line 52, among which the number of the data output terminals OP1~OPm is greater than that of the bit register units RG1~RGn. The control unit 51 is utilized for generating the control signal CTRL to the bus line 52 for controlling the input signal DIN transferring among the bit register unit RG1~RGn. Preferably, each of the bit register units RG1~RGn includes a flip-flop FF, an input terminal switch unit IN_SW, and an output terminal switch unit OUT_SW. The flip-flop FF includes an input terminal D, a clock input terminal C and an output terminal Q. The input terminal switch unit IN_SW is coupled to the input terminal of the flip-flop FF, and is utilized for switching the input terminal of the flip-flop FF to couple to the output terminal of another flip-flop according to the control signal CTRL. The output terminal switch unit OUT_SW is coupled to the output terminal of the flip-flop FF, and is utilized for switching the output terminal of the flip-flop FF to couple to one of the data output terminals OP1~OPm according to the control signal CTRL.

Therefore, in the shift register 50 of the present invention, the input terminal of the flip-flop can be coupled to the output terminal of a flip-flop in any stage by the input terminal switch unit IN_SW, and the output terminal of the flip-flop can be coupled to any one of the data output terminals OP1~OPm by the output terminal switch unit OUT_SW. In this case, the shift register 50 of the present invention can control the input signal repeatedly transferring among the bit register units RG1~RGn, and can sequentially output pulse signals generated by the flip-flops to the data output terminals OP1~Opm, so that the number of flip-flops that need to be used in the shift register can be reduced significantly, and further, circuit area and production cost can be saved.

Figure 8:
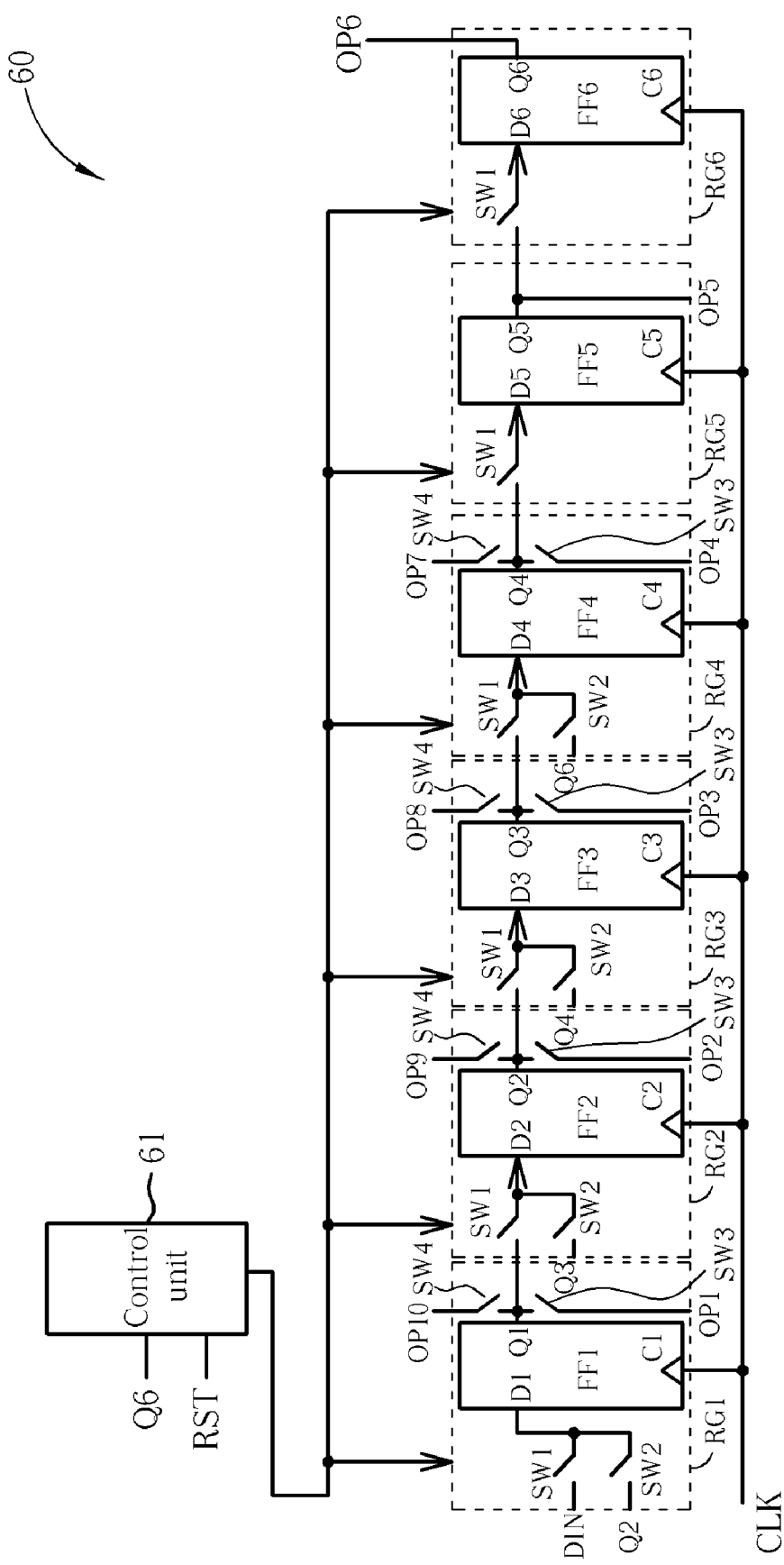
FIG. 8 is a schematic diagram of a shift register according to an embodiment of the present invention.

For example, please refer to FIG. 8. FIG. 8 is a schematic diagram of a shift register 60 according to an embodiment of the present invention. The shift register 60 is a shift register with ten data output terminals designed according to the shift register 50, and includes bit register units RG1~RG6, data output terminals OP1~OP10 and a control unit 61. In the shift register 60, each of the input terminal switch units IN_SW includes a first switch SW1 and a second switch SW2, and is utilized for switching the input terminal of each flip-flop to couple to the output terminal of a former stage flip-flop or that of a next stage flip-flop according to a logic level of the control signal CTRL. Each of the output terminal switch units OUT_SW in the bit register units RG1~RG4 includes a third switch SW3 and a fourth switch SW4, and is utilized for switching the output terminal $Q_N$ of the $N^{th}$ flip-flop to couple to the $N^{th}$ data output terminal $OP_N$ or the $(11-N)^{th}$ data output terminal $OP_{(11-N)}$ according to the logic level of the control signal CTRL. Preferably, when the logic level of the control signal CTRL is low, the input terminal switch unit IN_SW shorts the first switch SW1 to couple the input terminal of each flip-flop to the output terminal of a former stage flip-flop, and meanwhile, the output terminal switch unit OUT_SW shorts the third switch SW3 to couple the output terminal $Q_N$ of the $N^{th}$ flip-flop to the $N^{th}$ data output terminal $OP_N$. On the other hand, when the logic level of the control signal CTRL is high, the input terminal switch unit IN_SW then shorts the second switch SW2 to couple the input terminal of each flip-flop to the output terminal of a next stage flip-flop, and meanwhile, the output terminal switch unit OUT_SW shorts the fourth switch SW4 to couple the output terminal of the $N^{th}$ flip-flop to the $(11-N)^{th}$ data output terminal $OP_{(11-N)}$. Besides, the control unit 61 converts the logic level of the control signal CTRL when a pulse signal output by the last bit register unit of the shift register 60 (i.e. the bit register unit RG6) or a reset signal RST is received.

Figure 1:
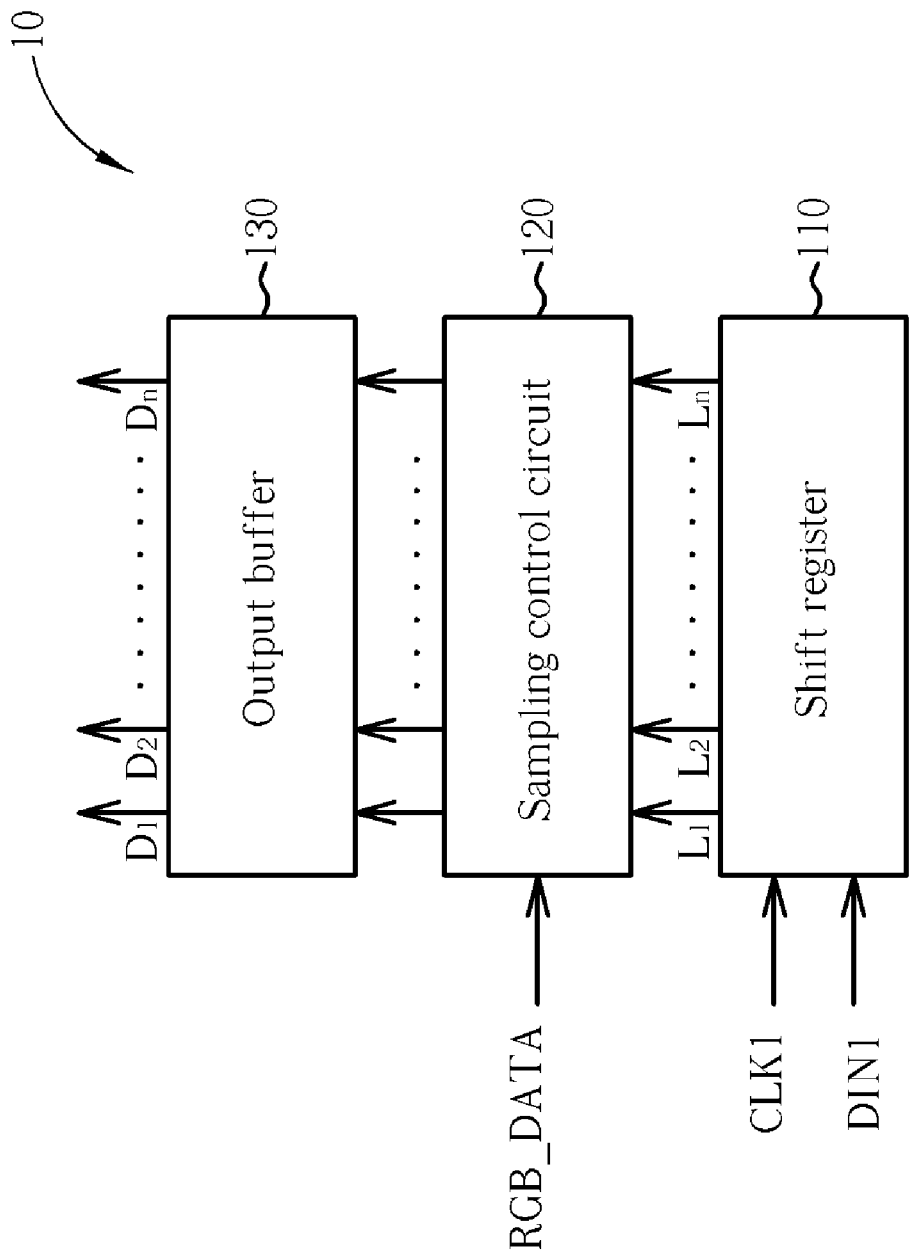
FIG. 1 and FIG. 2 are functional block diagrams of a source driver circuit and a gate driver circuit of a conventional LCD, respectively.
Figure 2:
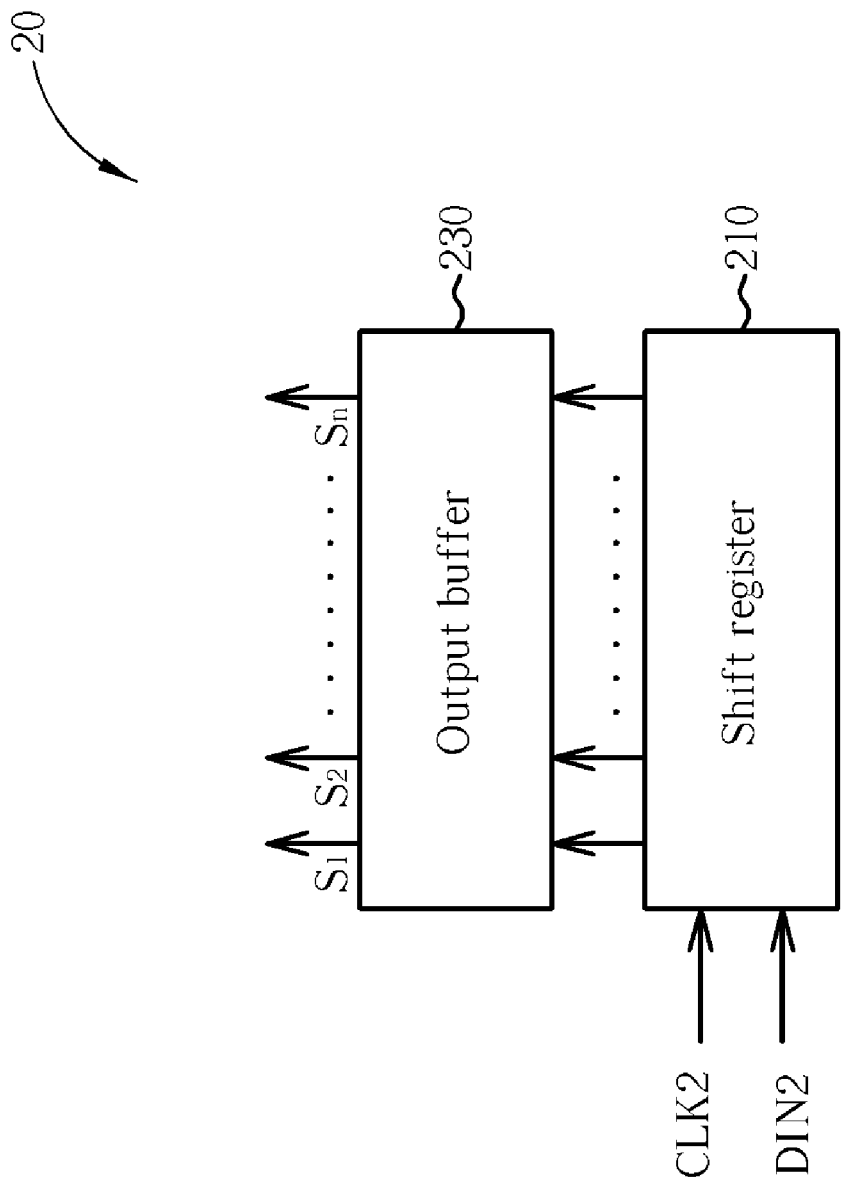
Figure 3:
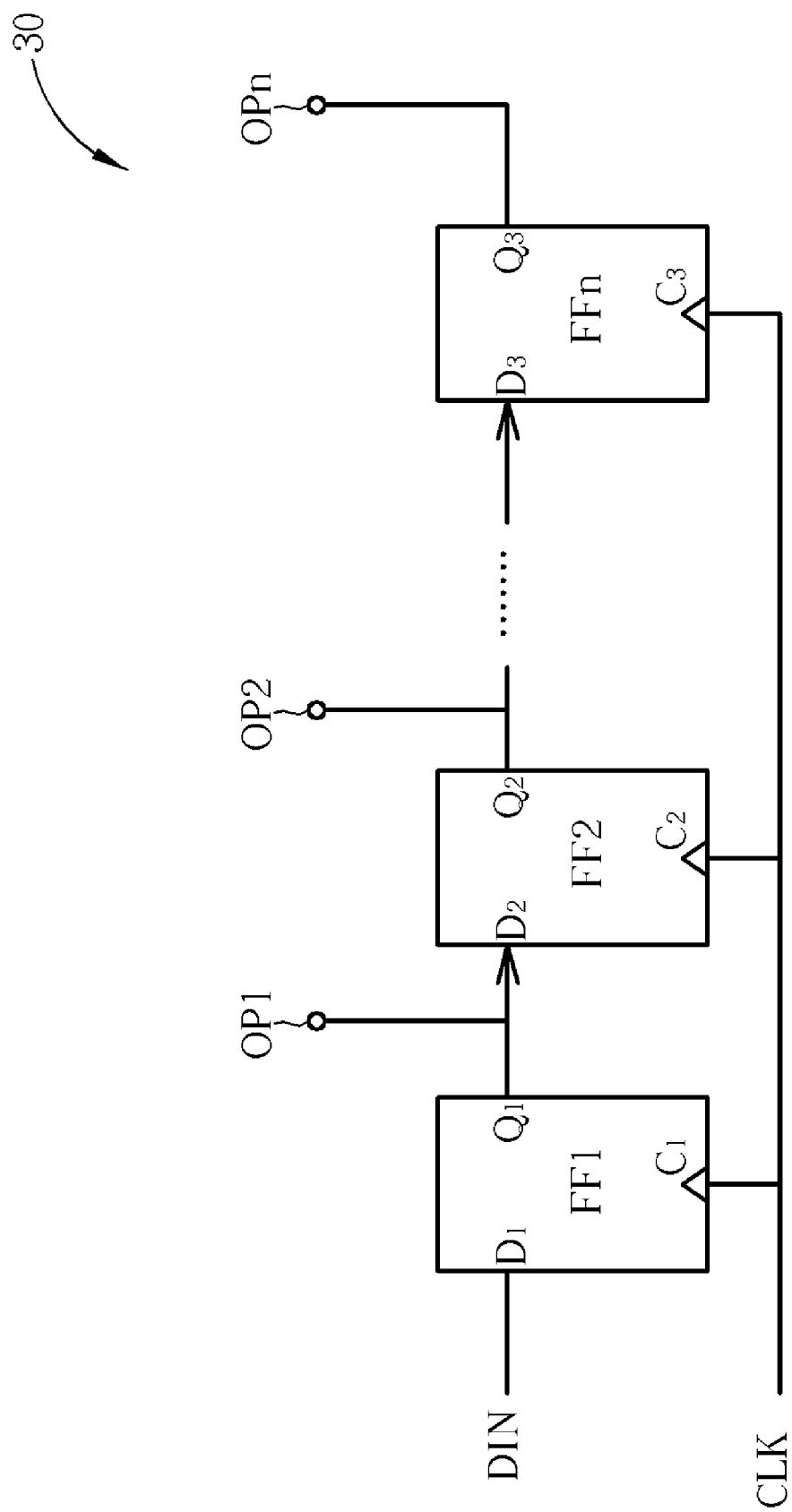
FIG. 3 is a schematic diagram of a conventional shift register.
Figure 4:
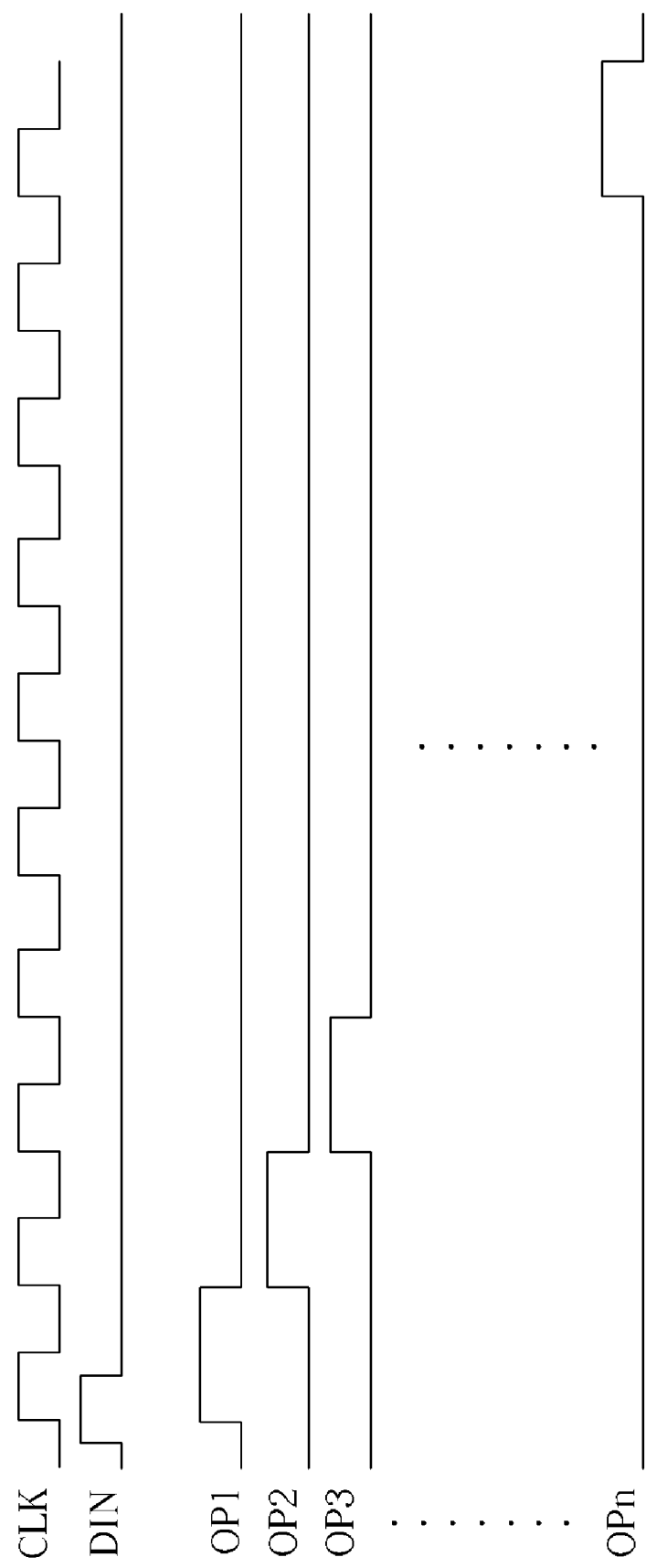
FIG. 4 shows the related signal sequence of the shift register in FIG. 3.
Figure 5:
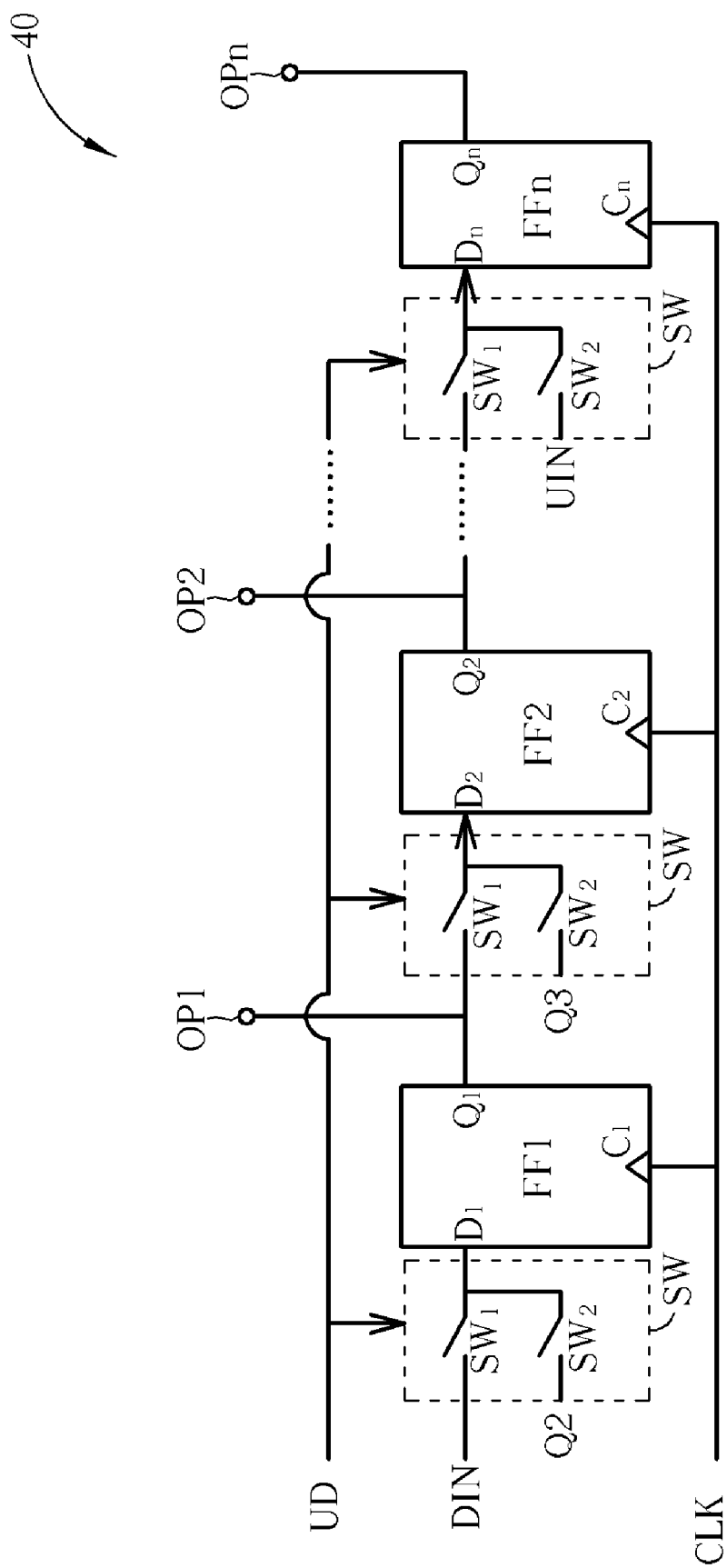
FIG. 5 is a schematic diagram of another conventional shift register.
Figure 6:
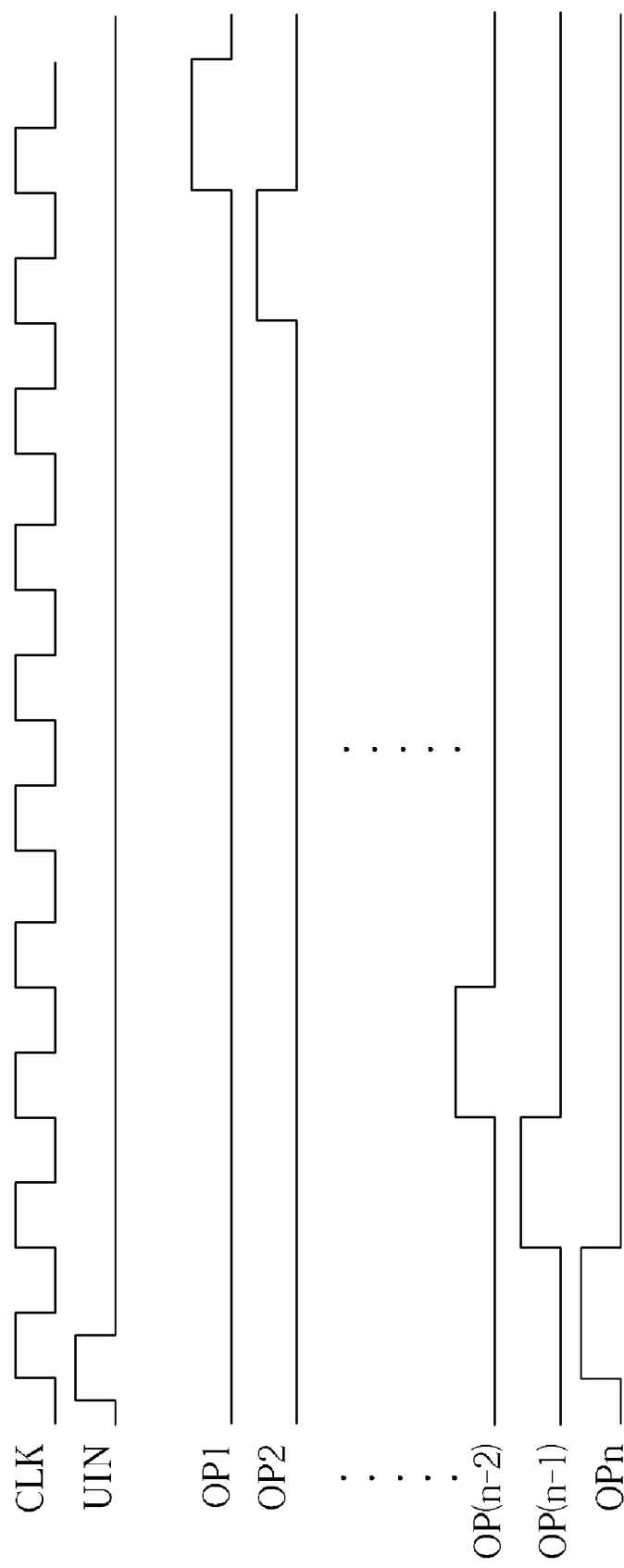
FIG. 6 shows the related signal sequence of the shift register in FIG. 5.
Figure 9:
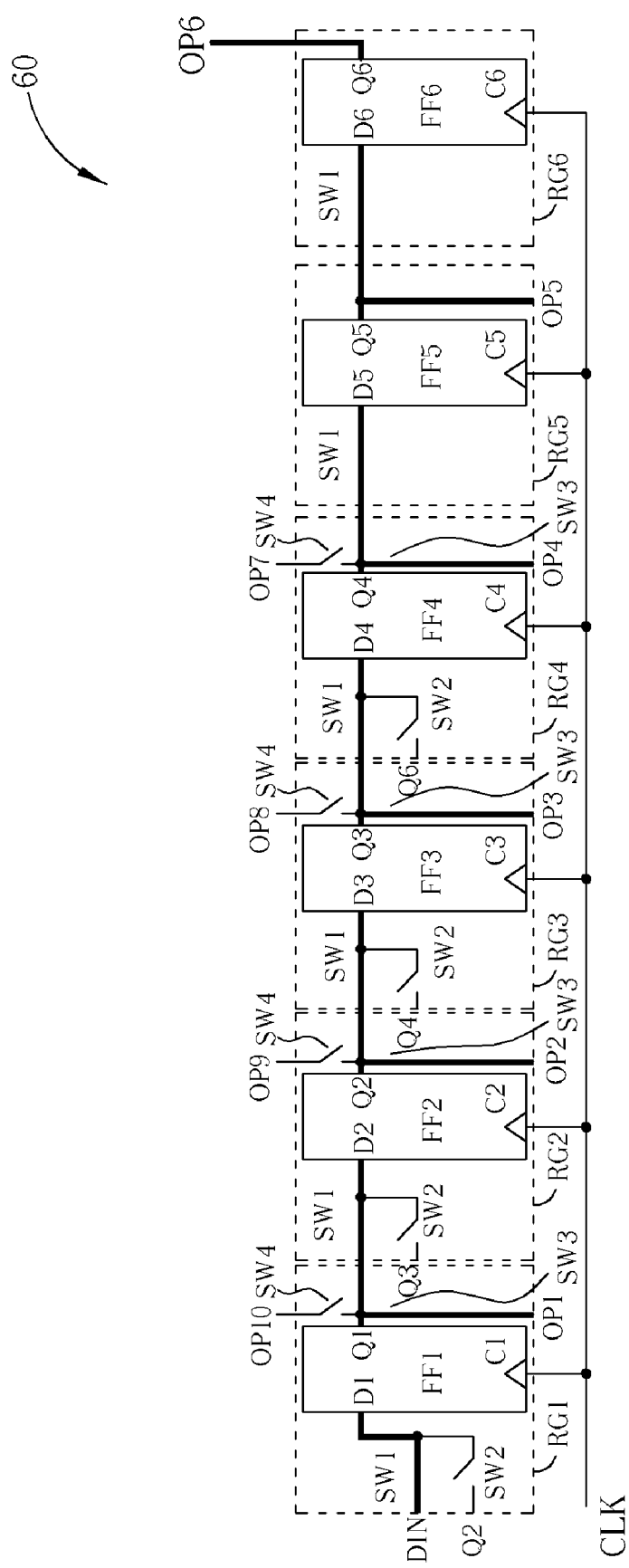
FIG. 9 and FIG. 10 show signal paths of an input signal forward and backward transferring in the shift register of FIG. 8, respectively.
Figure 10:
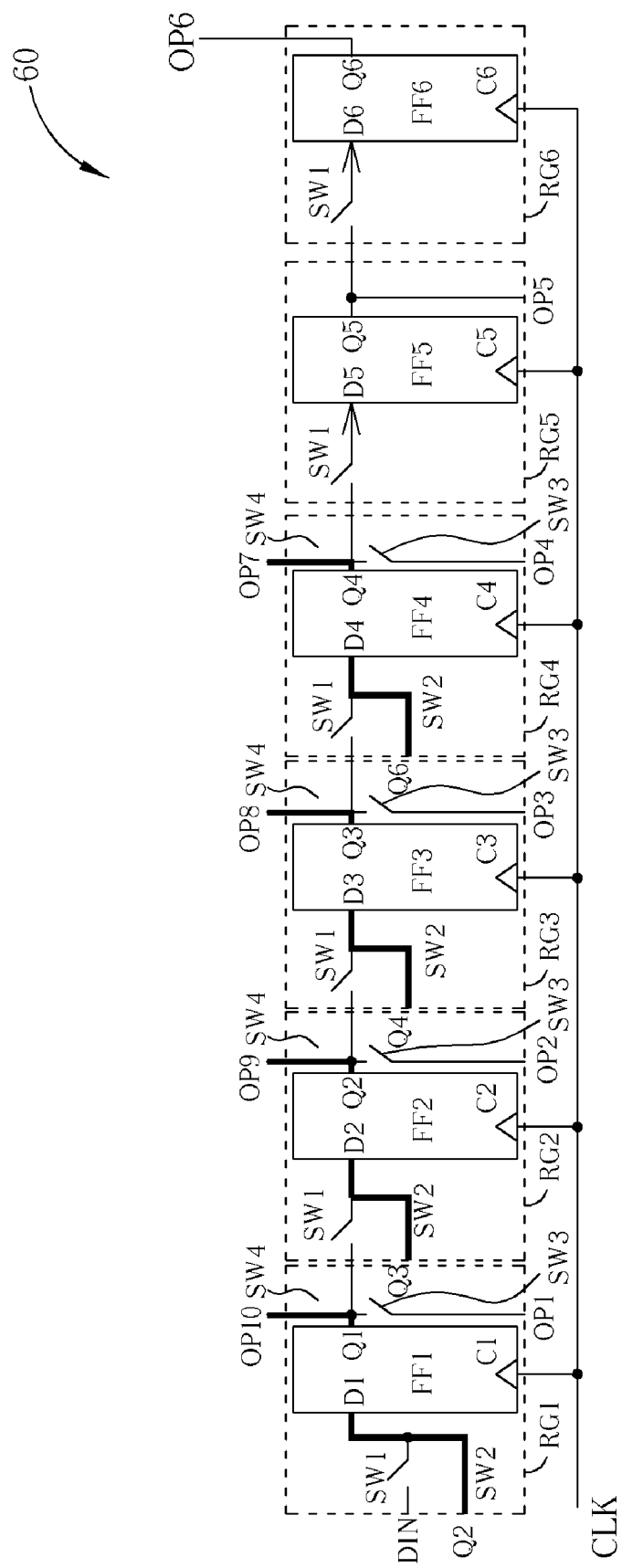
Figure 11:
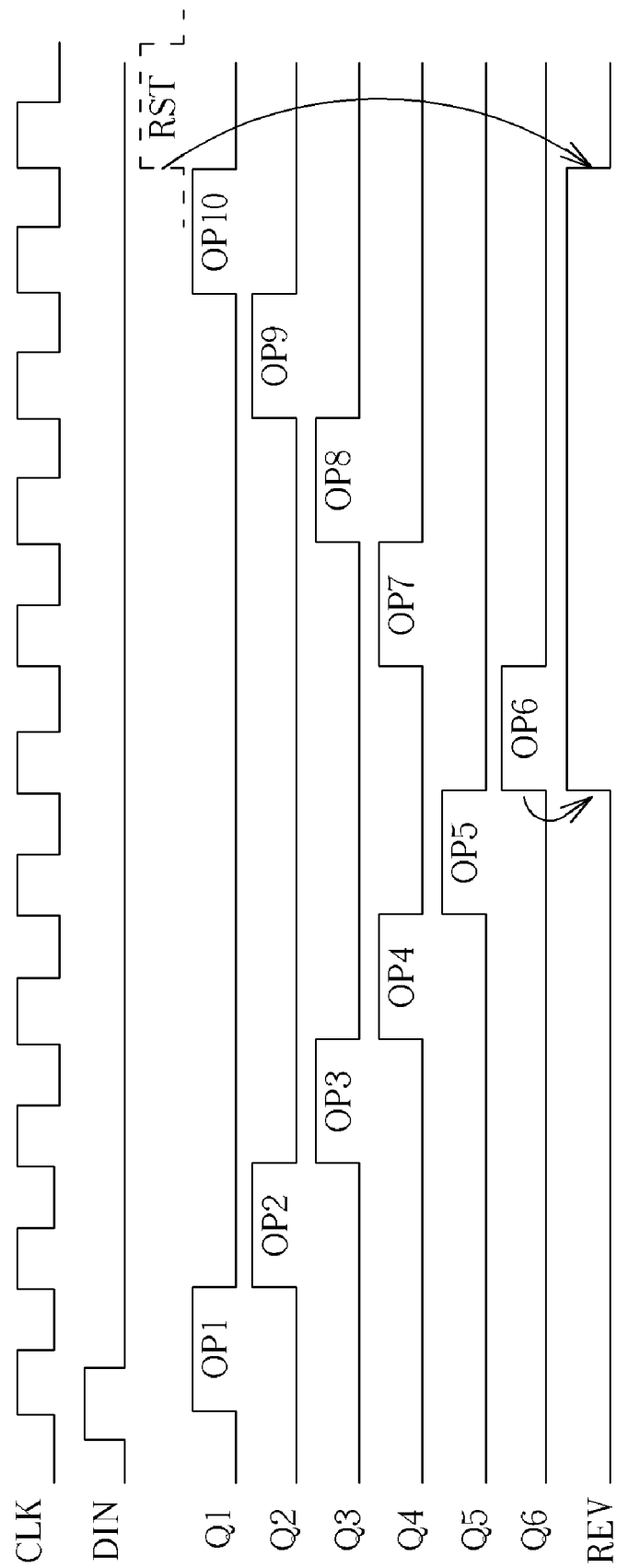
FIG. 11 shows the related signal sequence of the shift register in FIG. 8.

Therefore, when an input signal DIN is received, the shift register 60 can utilize the flip-flops FF1~FF6 for forward transferring the input signal DIN according to the clock signal CLK and the low logic level of the control signal CTRL, and can thus forward output pulse signals to the data output terminals OP1~OP6 in order. When the input signal DIN is transferred to the last bit register unit (i.e. the bit register unit RG6), the control unit 61 then converts the logic level of the control signal CTRL to be high according to the pulse signal outputted by the flip-flop FF6, and the input signal DIN is transferred back to the input terminal of the flip-flop FF4 at the same time. Thus, the shift register 60 can utilize the flip-flops FF4~FF1 for backward transferring the input signal DIN according to the clock signal CLK and the high logic level of the control signal CTRL, and can output pulse signals to the data output terminals OP7~OP10 in order. Please refer to FIG. 9 and FIG. 10, which illustrate signal paths of the input signal DIN forward and backward transferring in the shift register 60, respectively. As for the related signal sequence of the shift register 60, please refer to FIG. 1.

In other words, by properly switching the switches inside the input terminal switch unit IN_SW and the output terminal switch unit OUT_SW according to the control signal CTRL, the embodiment of the present invention can control the input signal to transfer back and forth among the bit register units RG1~RG6, and can forward output the pulse signals to the data output terminals OP1~OP10 in order. Therefore, in the present invention, a small amount of flip-flops can be used cyclically to achieve output of pulse signals to a large number of data output terminals, so as to save circuit area significantly. For example, in the embodiment, six flip-flops are used for realizing a shift register with ten data output terminals.

Figure 12:
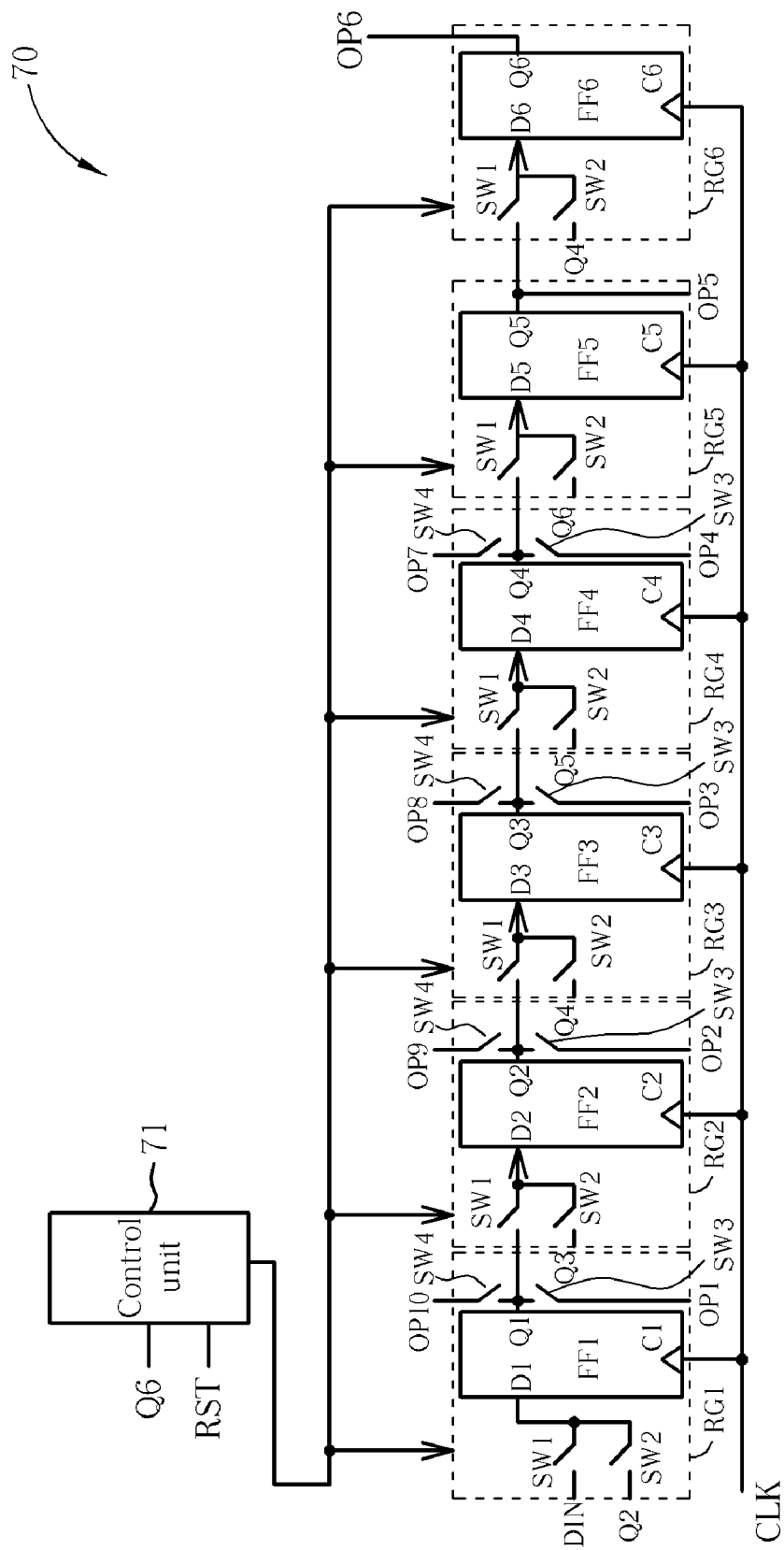
FIG. 12 is a shift register according to another embodiment of the present invention.

Please note that the above-mentioned embodiment is merely an exemplary illustration of the present invention but not a limitation of the present invention, and those skilled in the art can certainly make appropriate modifications according to practical demands. Please further refer to FIG. 12. FIG. 12 is a shift register 70 according to another embodiment of the present invention. The shift register 70 is similar to the shift register 60, and the allocation of switches inside the input terminal switch unit IN_SW and the output terminal switch unit OUT_SW of each bit register unit is as shown in FIG. 12. Compared with the shift register 60, when the logic level of the control signal CTRL is high in the embodiment, the input terminal switch unit IN_SW shorts the first switch SW1 to couple the input terminal of each flip-flop to the output terminal of a former stage flip-flop, and meanwhile, the output terminal switch unit OUT_SW shorts the fourth switch SW4 to couple the output terminal of the $N^{th}$ flip-flop to the $(11-N)^{th}$ data output terminal $OP_{(11-N)}$. On the other hand, when the logic level of the control signal CTRL is low, the input terminal switch unit IN_SW shorts the second switch SW2 to couple the input terminal of each flip-flop to the output terminal of a next stage flip-flop, and meanwhile, the output terminal switch unit OUT_SW shorts the third switch SW3 to couple the output terminal of the $N^{th}$ flip-flop to the $N^{th}$ data output terminal $OP_N$.

Figure 13:
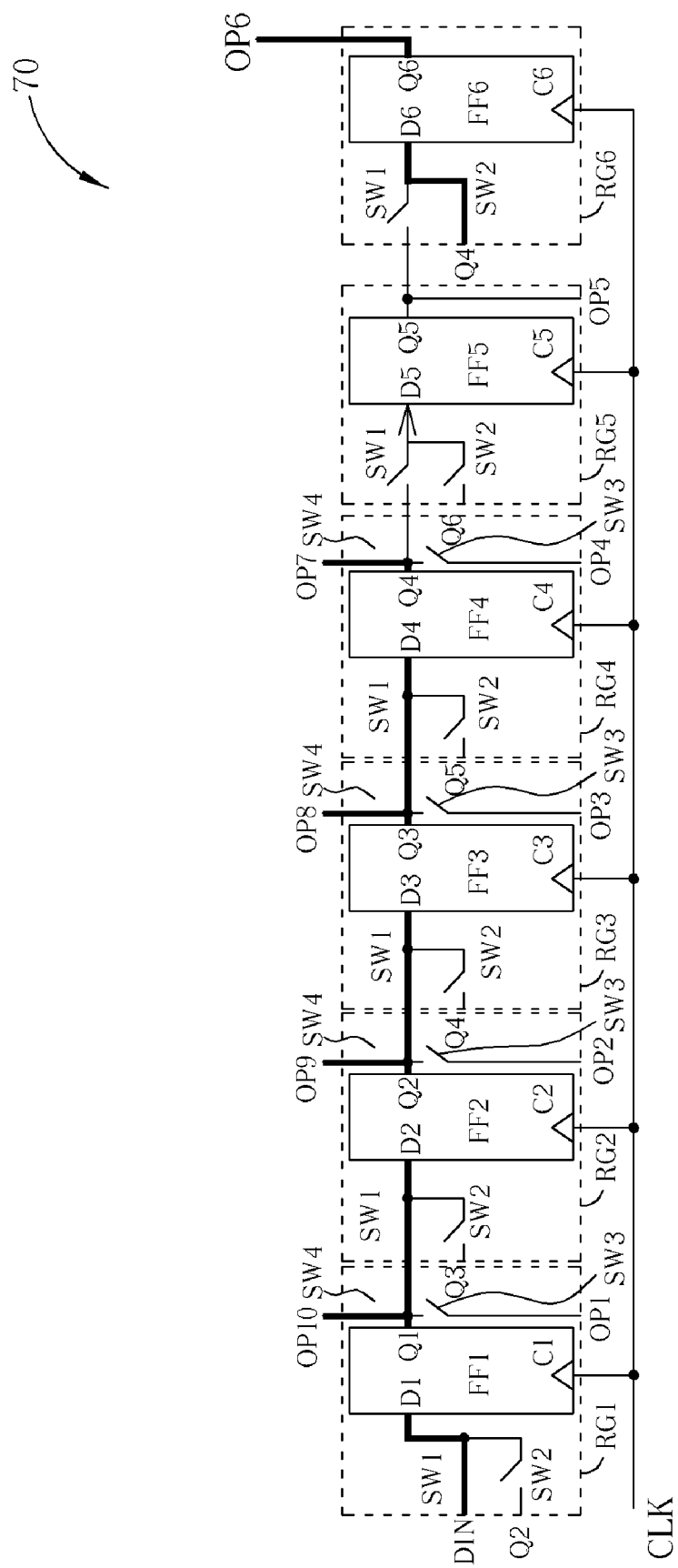
FIG. 13 and FIG. 14 show signal paths of an input signal forward and backward transferring in the shift register in FIG. 12, respectively.
Figure 14:
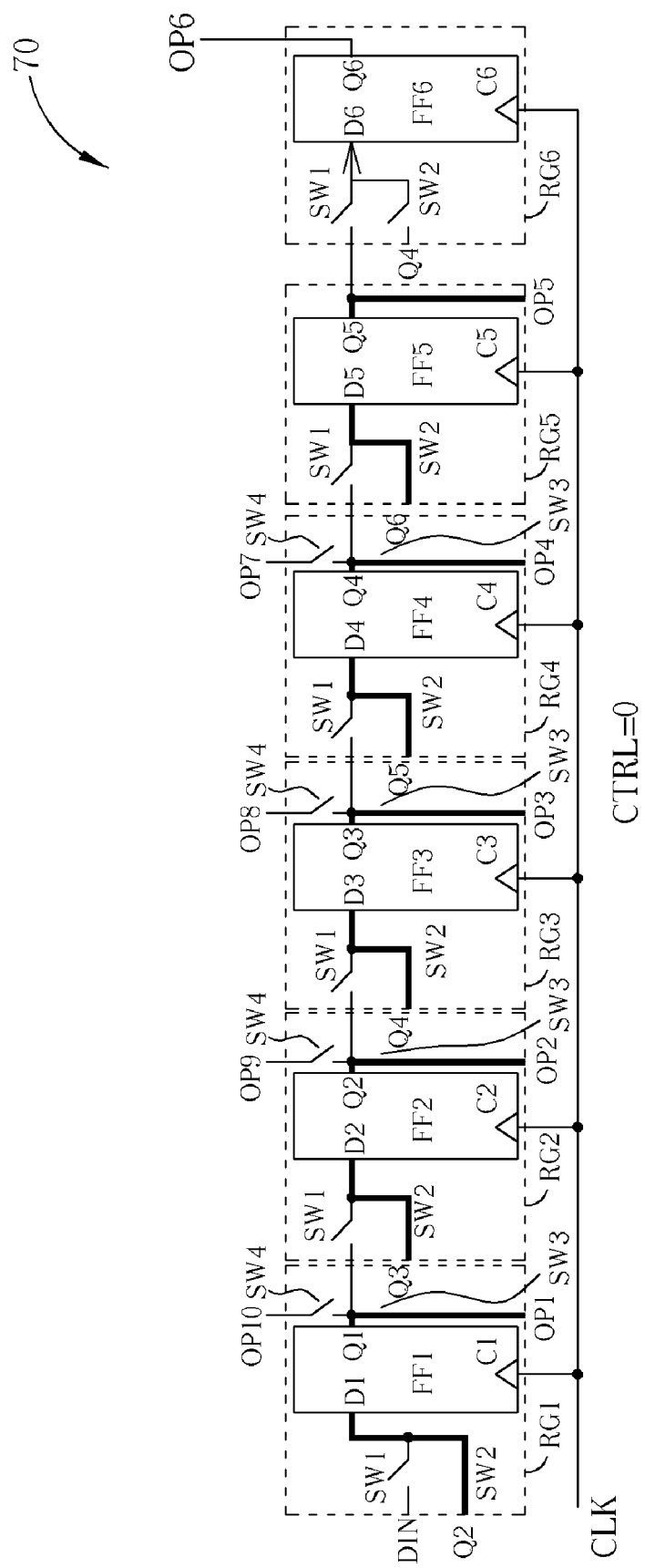
Figure 15:
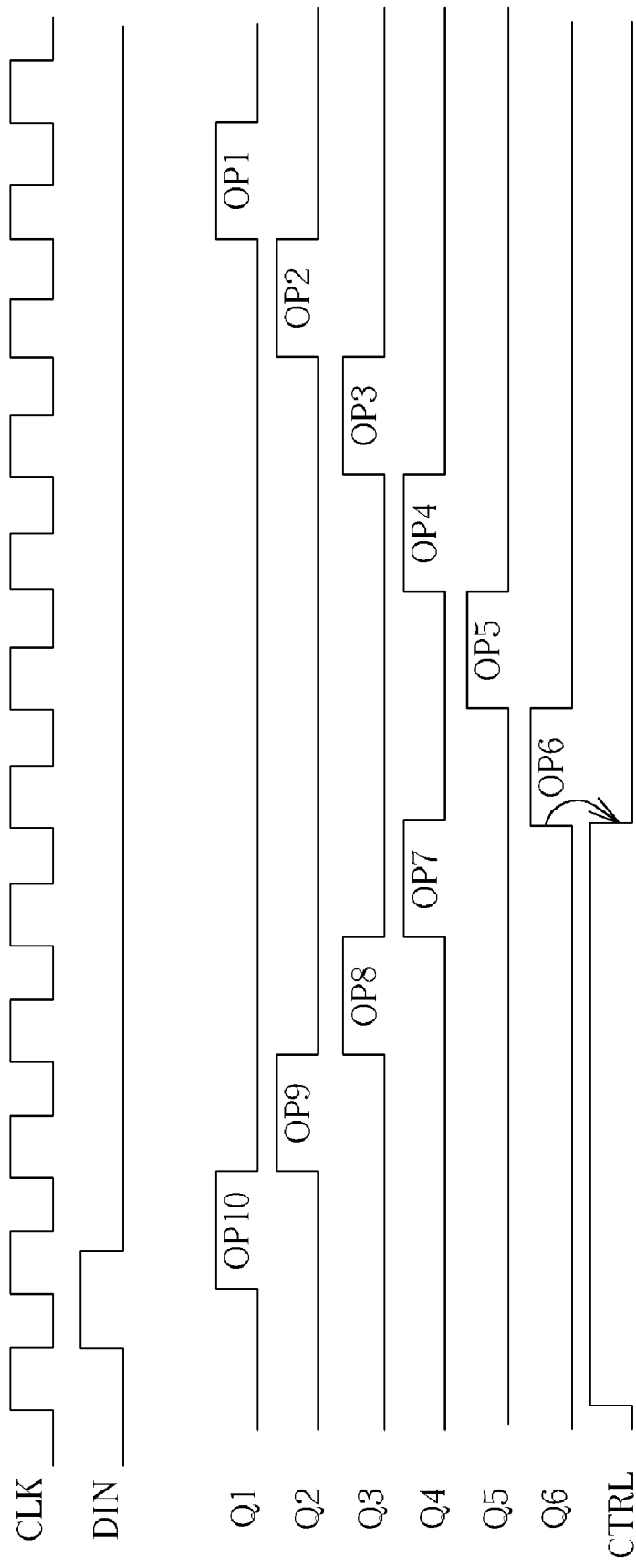
FIG. 15 shows related signal sequences of the shift register in FIG. 12.

Thus, when an input signal DIN is received, the shift register 70 can utilize the flip-flops FF1~FF4 for forward transferring the input signal DIN according to the clock signal CLK and the high logic level of the control signal CTRL, and can thus sequentially output pulse signals to the data output terminals OP1~OP7 in reverse order. When the input signal DIN is transferred to the bit register unit RG4, the pulse signal outputted from the output terminal of the flip-flop FF4 is then received by the input terminal of the flip-flop FF6, and is outputted to the data output terminal OP6 on a next clock cycle. Meanwhile, the control unit 71 converts the logic level of the control signal CTRL to be low according to the pulse signal outputted by the flip-flop FF6, and transfers the input signal DIN back to the input terminal of the flip-flop FF5 at the same time. Then, the shift register 70 can utilize the flip-flops FF5~FF1 for backward transferring the input signal DIN according to the clock signal CLK and the low logic level of the control signal CTRL, and can sequentially output pulse signals to the data output terminals OP5~OP1 in reverse order. Please refer to FIG. 13 and FIG. 14, which illustrate signal paths of the input signal DIN forward and backward transferring in the shift register 70, respectively. As for the related signal sequence of the shift register 70, please refer to FIG. 15.

Therefore, by properly switching the switches inside the input terminal switch unit IN_SW and the output terminal switch unit OUT_SW, the present invention not only can forward provide the pulse signals to the data output terminals OP1~OP10 in order, but can also output the pulse signals to the data output terminals OP10~OP1 in reverse order, so as to enhance flexibility of use. Certainly, those skilled in the art can appropriately combine the shift register 60 and the shift register 70 to provide functions of outputting pulse signals in both directions, which also belongs to the scope of the present invention.

Figure 16:
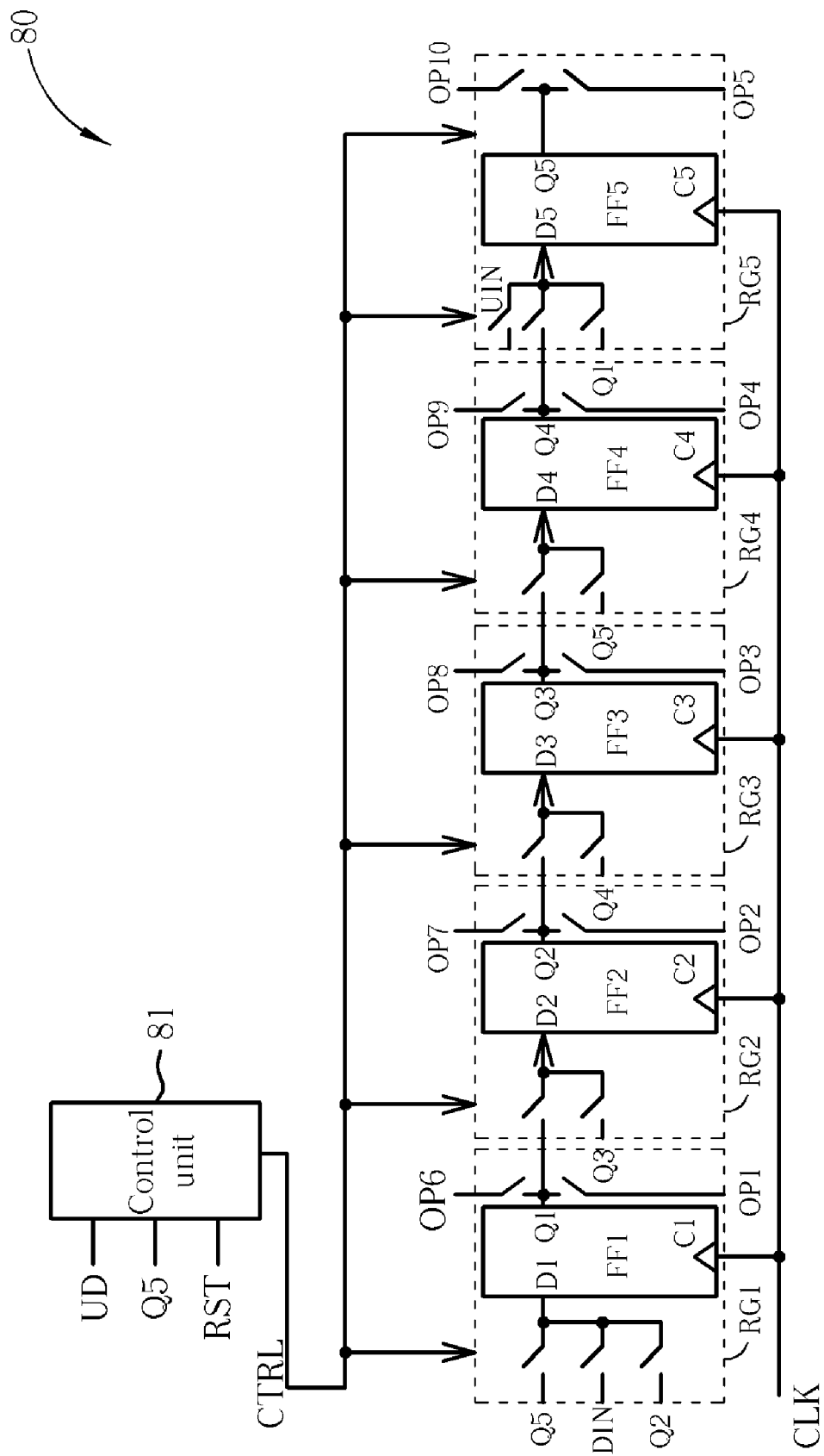
FIG. 16 is a schematic diagram of a shift register according to an embodiment of the present invention.
Figure 17:
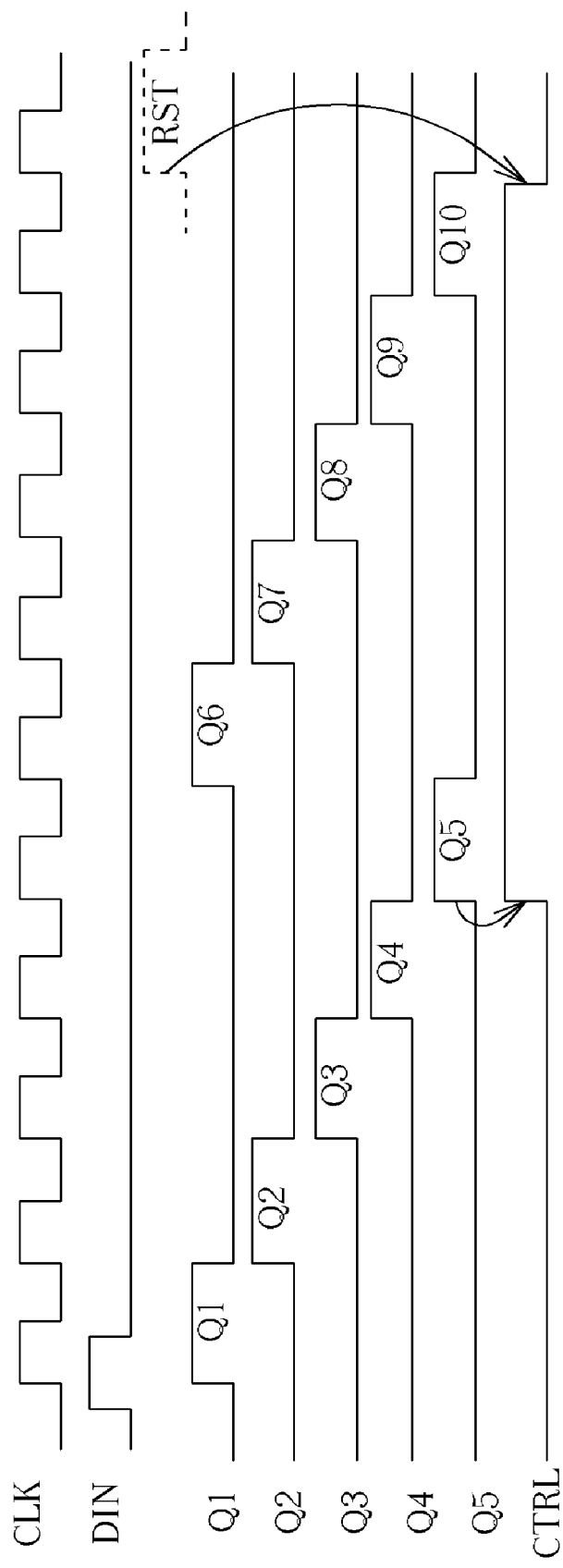
FIG. 17 shows related signal sequences of the shift register in FIG. 16.

Please refer to FIG. 16. FIG. 16 is a schematic diagram of a shift register 80 according to an embodiment of the present invention. The shift register 80 is another shift register with ten data output terminals designed according to the shift register 50, and includes bit register units RG1~RG5, data output terminals OP1~OP10, and a control unit 81. The allocation of switches inside the input terminal switch unit IN_SW and the output terminal switch unit OUT_SW of each bit register unit is as shown in FIG. 16, and not narrated herein. Preferably, if the shift register 80 is about to forward output the pulse signals, the input terminal switch unit IN_SW switches the input terminal of each flip-flop to couple to the output terminal of a former stage flip-flop for forward transferring the input signal DIN, and the output terminal switch unit OUT_SW switches the output terminal $Q_N$ of the $N^{th}$ flip-flop to couple to the $N^{th}$ data output terminal $OP_N$ or the $(N+T/2)^{th}$ data output terminal $OP_{(N+T/2)}$ according to a low logic level or a high logic level of the control signal CTRL, where T is the number of the data output terminals. Thus, when the input signal DIN is received, the shift register 80 can utilize the flip-flops FF1~FF5 to forward transfer the input signal DIN according to the clock signal CLK and the low logic level of the control signal CTRL, and can forward output pulse signals to the data output terminals OP1~OP5 in order. Then, the control unit 81 converts the logic level of the control signal CTRL to be high according to the pulse signal outputted by the flip-flop FF5, and the input signal DIN is retransferred to the input terminal of the flip-flop FF1 at the same time. Thus, the shift register 80 can utilize the flip-flops FF1 FF5 again to forward transfer the input signal DIN according to the clock signal CLK and the high logic level of the control signal CTRL, and can forward output pulse signals to the data output terminals OP6~OP10 in order. As for the related signal sequences of the shift register 80, please refer to FIG. 17.

In like manner, if the shift register 80 is operated for backward outputting the pulse signals, i.e. in reverse order, when an input signal UIN is received by the bit register unit RG5 of the shift register 80, the shift register 80 first utilizes the flip-flops FF5~FF1 for backward transferring the input signal UIN and sequentially outputting the pulse signals to the data output terminals OP10~OP6 in reverse order. Then, the control unit 81 converts the logic level of the control signal CTRL according to the pulse signal outputted by the flip-flop FF1, and retransfers the input signal UIN to the input terminal of the flip-flop FF5. Thus, the shift register 80 can utilize the flip-flops FF5~FF1 again for backward transferring the input signal UIN and sequentially outputting to the data output terminals OP5~OP1 correspondingly. Therefore, compared with the shift register 60 and the shift register 70 that transfer the input signal back and forth, the shift register 80 retransfers the input signal from an initial bit register unit again when the input signal is transferred to the last bit register unit, which is also capable of saving the number of the flip-flops.

Figure 18:
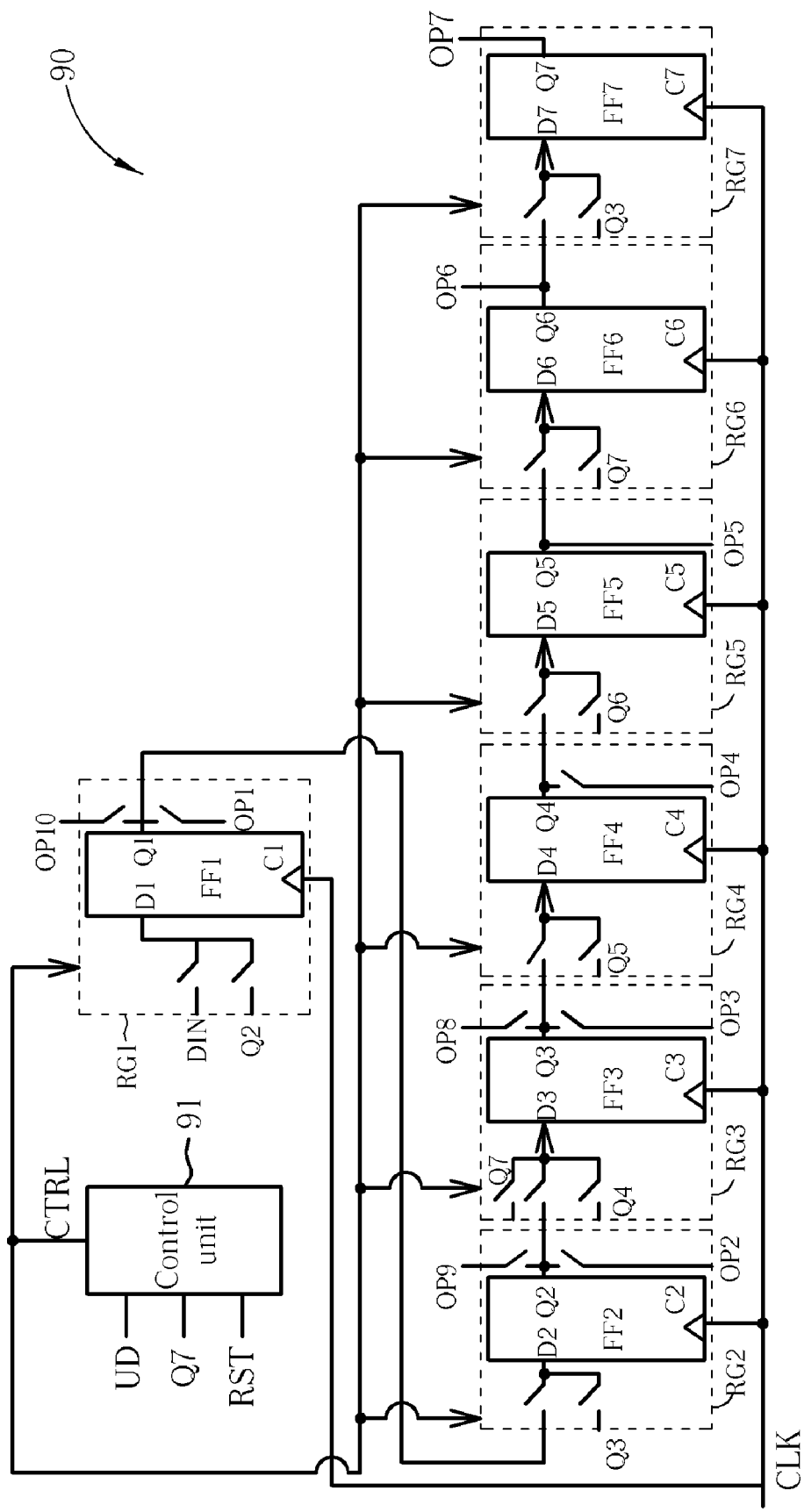
FIG. 18 is a schematic diagram of a shift register according to another embodiment of the present invention.
Figure 19:
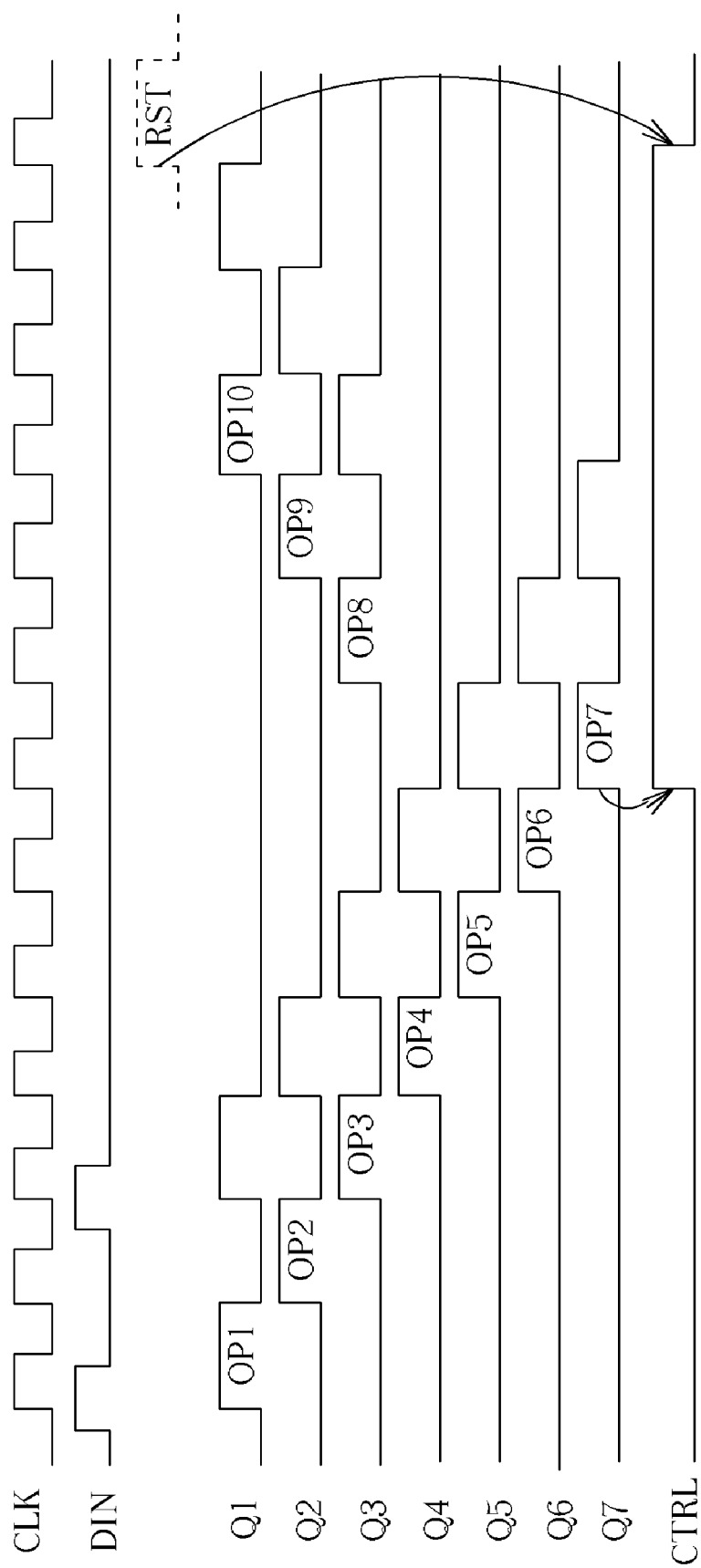
FIG. 19 shows related signal sequences of the shift register in FIG. 18.

In addition, in some applications such as driver circuits of the LCD, the shift register circuit sometimes needs to transfer two consecutive input signals. Please refer to FIG. 18. FIG. 18 is a schematic diagram of a shift register 90 according to another embodiment of the present invention. The shift register 90 is utilized for transferring two consecutive input signals, and includes bit register units RG1~RG7, data output terminals OP1~OP10 and a control unit 91. The allocation of switches inside the input terminal switch unit IN_SW and the output terminal switch unit OUT_SW of each bit register unit is as shown in FIG. 18, and not narrated herein. In this case, seven flip-flops are needed to realize the shift register 90, and operation of the shift register 90 is similar to that of the shift register 60. First, the shift register 90 utilizes the flip-flops FF1~FF7 to forward transfer the input signal DIN, and forward outputs the two consecutive signals to the corresponding data output terminals OP1~OP7 in order. Then, the control unit 91 converts the logic level of the control signal CTRL to be high according to the pulse signal outputted by the flip-flop FF7, and transfers the pulse signal outputted by the flip-flop FF7 to the input terminal of the flip-flop FF3. Thus, the shift register 90 can then utilize the flip-flops FF3~FF1 to backward transfer the input signal DIN, and forward output to the corresponding data output terminals OP8~OP10 in order. Moreover, when finishing transferring the input signal DIN in the shift register 90, the control unit 91 can convert the logic level of the control signal CTRL again according to a reset signal RST to wait for a next signal transfer operation. As for the related signal sequence of the shift register 90, please refer to FIG. 19.

As mentioned above, by utilizing the input terminal switch unit and the output terminal switch unit, the shift register of the present invention can control transfer of the input signal among the bit register units for forward or backward outputting the pulse signals to the data output terminals in order. Therefore, by way of cyclically using the flip-flops, the present invention can significantly save the number of flip-flops that need to used when transferring pulse signals to a large amount of data output terminals, so that circuit area and production cost can be saved as well.

Those skilled in the art will readily observe that numerous modifications and alterations of the device and method may be made while retaining the teachings of the invention.

What is claimed is:

1. A shift register circuit comprising:
    a plurality of bit register units, coupled in series, for transferring an input signal among the plurality of bit register units to sequentially output the input signal to a plurality of data output terminals according to a control signal and a clock signal, wherein the number of the plurality of data output terminals is greater than that of the plurality of bit register units, at least one of the plurality of bit register units comprising:
        a register comprising an input terminal, a clock input terminal and an output terminal;
        an input terminal switch unit, coupled to the input terminal of the register, for switching the input terminal of the register to couple to another bit register unit according to the control signal; and
        an output terminal switch unit, coupled to the output terminal of the register, for switching the output terminal of the register to couple to one of the plurality of data output terminals according to the control signal; and
    a control unit coupled to the plurality of bit register units for generating the control signal to control transference of the input signal.

2. The shift register circuit of claim 1, wherein the register is a flip-flop.

3. The shift register circuit of claim 1, wherein the input terminal switch unit switches the input terminal of the register to couple to a former bit register unit for forward transferring the input signal among the plurality of bit register units according to a first voltage level of the control signal.

4. The shift register circuit of claim 1, wherein the input terminal switch unit switches the input terminal of the register to couple to a later bit register unit for backward transferring the input signal among the plurality of bit register units according to a second voltage level of the control signal.

5. The shift register circuit of claim 1, wherein the plurality of bit register units converts a transference direction of the input signal transferring among the plurality of bit register units according to a voltage level of the control signal.

6. The shift register circuit of claim 5, wherein the control unit converts the voltage level of the control signal when the input signal is transferred to a last bit register unit of the plurality of bit register units.

7. The shift register circuit of claim 6, wherein the last bit register unit is a bit register unit located in a last position of a sequence formed by the plurality of bit register units.

8. The shift register circuit of claim 5, wherein the control unit converts the voltage level of the control signal when a reset signal is received.

9. The shift register circuit of claim 1, wherein the plurality of bit register units retransfer the input signal among the plurality of bit register units according to a voltage level of the control signal.

10. The shift register circuit of claim 9, wherein the control unit converts the voltage level of the control signal when the input signal is transferred to a last bit register unit of the plurality of bit register units.

11. The shift register circuit of claim 10, wherein the last bit register unit is a bit register unit located in a last position of a sequence formed by the plurality of bit register units.

12. The shift register circuit of claim 9, wherein the control unit converts the voltage level of the control signal when a reset signal is received.

13. The shift register circuit of claim 1, wherein the input signal is outputted in reverse order to the plurality of data output terminals according to a transference direction control signal.

14. The shift register circuit of claim 1, wherein the shift register circuit is utilized as a driver circuit of a liquid crystal display (LCD).

* * * * *